(12) United States Patent
Dang et al.

(10) Patent No.: US 9,876,167 B2
(45) Date of Patent: Jan. 23, 2018

(54) HIGH YIELD RRAM CELL WITH OPTIMIZED FILM SCHEME

(71) Applicant: Taiwan Semiconductor Manufacturing Co., Ltd., Hsin-Chu (TW)

(72) Inventors: Trinh Hai Dang, Hsinchu (TW);
Hsing-Lien Lin, Hsin-Chu (TW);
Cheng-Yuan Tsai, Chu-Pei (TW);
Chin-Chieh Yang, New Taipei (TW);
Yu-Wen Liao, New Taipei (TW);
Wen-Ting Chu, Kaohsiung (TW);
Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 31 days.

(21) Appl. No.: 14/592,340

(22) Filed: Jan. 8, 2015

(65) Prior Publication Data

US 2015/0287917 A1    Oct. 8, 2015

Related U.S. Application Data

(63) Continuation-in-part of application No. 14/242,983, filed on Apr. 2, 2014.

(51) Int. Cl.
*H05B 3/00* (2006.01)
*H01L 45/00* (2006.01)

(52) U.S. Cl.
CPC .......... *H01L 45/1233* (2013.01); *H01L 45/08* (2013.01); *H01L 45/12* (2013.01);
(Continued)

(58) Field of Classification Search
CPC .. H05B 3/00; G11C 13/0002; G11C 13/0014; H01L 27/24
See application file for complete search history.

(56) References Cited

U.S. PATENT DOCUMENTS 8,350,247 B2    1/2013  Lee et al.
8,598,560 B1 *  12/2013 Milojevic ............. H01L 45/085
                                                          257/1
(Continued)

FOREIGN PATENT DOCUMENTS

CN    101071843 A    11/2007
CN    101572246 A    11/2009
(Continued)

OTHER PUBLICATIONS

Ducan, Dan. "Abstract Submitted for the MAR14 Meeting of The American Physical Society." Stanford University. Nov. 15, 2013.
(Continued)

*Primary Examiner* — Mohammad Choudhry
(74) *Attorney, Agent, or Firm* — Eschweiler & Potashnik, LLC

(57) ABSTRACT

The present disclosure relates to a method of forming a resistive random access memory (RRAM) cell having a good yield, and an associated apparatus. In some embodiments, the method is performed by forming a bottom electrode over a lower metal interconnect layer, and forming a variable resistance dielectric data storage layer having a first thickness onto the bottom electrode. A capping layer is formed onto the dielectric data storage layer. The capping layer has a second thickness that is in a range of between approximately 2 to approximately 3 times thicker than the first thickness. A top electrode is formed over the capping layer, and an upper metal interconnect layer is formed over the top electrode.

20 Claims, 9 Drawing Sheets

(52) U.S. Cl.
CPC ........ *H01L 45/146* (2013.01); *H01L 45/1616* (2013.01); *H01L 45/1641* (2013.01); *H01L 45/1675* (2013.01)

(56) References Cited

U.S. PATENT DOCUMENTS

| | | | |
|---|---|---|---|
| 2009/0039332 A1* | 2/2009 | Lee | H01L 45/04 257/4 |
| 2010/0051896 A1* | 3/2010 | Park | H01L 27/24 257/4 |
| 2010/0167463 A1 | 7/2010 | Sung | |
| 2011/0175050 A1* | 7/2011 | Chien | H01L 45/1253 257/4 |
| 2011/0248236 A1 | 10/2011 | Kim et al. | |
| 2011/0286275 A1* | 11/2011 | Jeon | G11C 16/0483 365/185.17 |
| 2012/0001141 A1 | 1/2012 | Hsieh et al. | |
| 2012/0063201 A1* | 3/2012 | Hayakawa | G11C 13/0007 365/148 |
| 2014/0117303 A1 | 5/2014 | Wang et al. | |

FOREIGN PATENT DOCUMENTS

| | | |
|---|---|---|
| CN | 101989644 A | 3/2011 |
| CN | 102097586 A | 6/2011 |
| CN | 103441214 A | 12/2013 |
| KR | 20120004827 A | 1/2012 |

OTHER PUBLICATIONS

U.S. Appl. No. 14/242,983, filed Apr. 2, 2014.
Wu, et al. "Investigation of ALD or PVD (Ti-rich vs. N-rich) TiN Metal Gate Thermal Stability on HfO2 High-K." International Symposium on VLSI Technology Systems and Applications (VLSI-TSA), 2010. Apr. 26-28, 2010.
Notice of Allowance dated Oct. 12, 2016 U.S. Appl. No. 14/242,983.

* cited by examiner

US 9,876,167 B2

HIGH YIELD RRAM CELL WITH OPTIMIZED FILM SCHEME

REFERENCE TO RELATED APPLICATION

This application is a continuation-in-part of U.S. application Ser. No. 14/242,983 filed on Apr. 2, 2014.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one promising candidate for next generation non-volatile memory technology due to its simple structure and its compatibility with CMOS logic fabrication processes. An RRAM cell includes a resistive data storage layer vertically located between two electrodes disposed within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
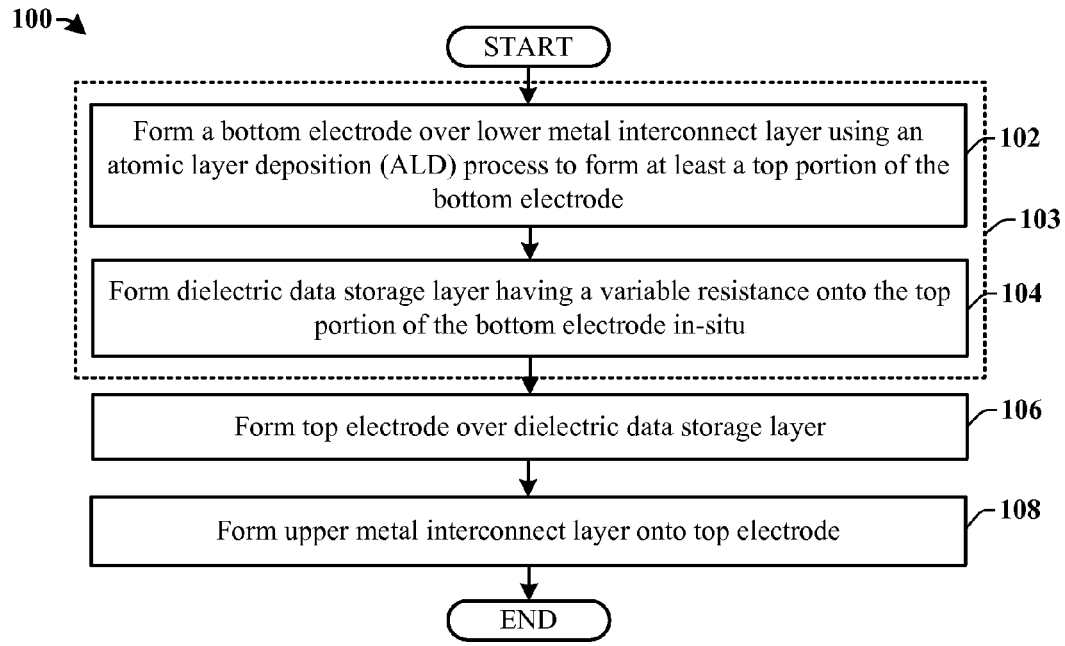
FIG. 1 illustrates a flow diagram of some embodiments of a method of forming a resistive random access memory (RRAM) cell using an atomic layer deposition (ALD) process to form a bottom electrode and an in-situ deposition process to form an overlying dielectric data storage layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells have a bottom electrode that is separated from an overlying top electrode by a dielectric data storage layer. The bottom electrode is typically deposited over a substrate using a physical vapor deposition (PVD) technique. The dielectric data storage layer is then formed ex-situ over the bottom electrode. However, it has been appreciated that bottom electrodes (e.g., TiN) formed using a PVD process scavenge oxygen that diffuses from the high-k dielectric layer towards the bottom electrode. The oxygen degrades the interface between the bottom electrode and the dielectric data storage layer, giving the RRAM cell a high leakage current that can result in low device yield (e.g., due to increasing leakage current near the edge of a wafer).

Accordingly, the present disclosure relates to a method of forming a resistive random access memory (RRAM) cell having a reduced leakage current, and an associated apparatus. In some embodiments, the method comprises forming a bottom electrode over a lower metal interconnect layer using an atomic layer deposition (ALD) process that forms at least a top portion of the bottom electrode. A dielectric data storage layer is formed onto the top portion of the bottom electrode in-situ with the formation of the top portion of the bottom electrode. A top electrode is then formed over the dielectric data storage layer, and an upper metal interconnect layer is formed over the top electrode. By forming the top portion of the bottom electrode using an ALD process that is in-situ with the formation of the overlying dielectric data storage layer, interfacial properties between the bottom electrode and the dielectric data storage layer are improved causing a reduction in the leakage current, leakage current distribution, and device yield of the RRAM cell.

FIG. 1 illustrates some embodiments of a method 100 of forming a resistive random access memory (RRAM) cell having a low leakage current, using an ALD process to form a bottom electrode and an in-situ ALD process to form an overlying dielectric data storage layer.

At 102, a bottom electrode is formed over a lower metal interconnect layer using an atomic layer deposition (ALD) process to form at least a top portion of the bottom electrode. The ALD process may comprise any type of atomic layer deposition process, including but not limited to ALD or plasma enhanced ALD (PEALD). The use of an ALD process to form the top portion of the bottom electrode can suppress the out-diffusion of oxygen into the bottom electrode, thereby improving the integrity of the interface between the bottom electrode and an overlying dielectric data storage layer.

At 104, a dielectric data storage layer having a variable resistance is formed onto the top portion of the bottom electrode in-situ with the formation of the bottom electrode. The in-situ formation of the dielectric data storage layer and the bottom electrode, illustrated by box 103, prevents the formation of an oxide interface layer (that can degrade the electrical performance of the RRAM cell) on the bottom electrode layer. In some embodiments, the dielectric data storage layer may be formed by way of an ALD process. In other embodiments, the dielectric data storage layer may be formed by other deposition techniques.

At 106, a top electrode is formed over the dielectric data storage layer.

At 108, an upper metal interconnect layer is formed over the top electrode. In some embodiments, the upper metal interconnect layer may comprise an upper metal via layer formed onto the top electrode. In other embodiments, the upper metal interconnect layer may further comprise an upper metal wire layer disposed onto the upper metal via layer.

Figure 2:
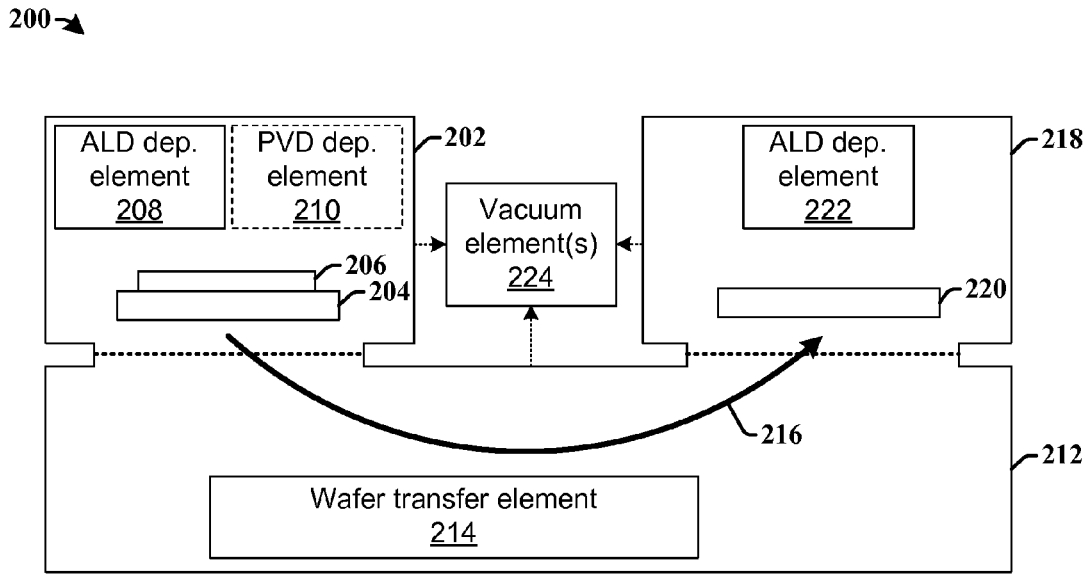
FIG. 2 illustrates a block diagram of some embodiments of a processing tool configured to perform in-situ a first ALD process to form a bottom electrode and a second ALD process to form an overlying dielectric data storage layer.

FIG. 2 illustrates a block diagram of some embodiments of a processing tool 200 configured to perform in-situ an ALD process to form a bottom electrode and an ALD process to form an overlying dielectric data storage layer for an RRAM cell.

The processing tool 200 comprises a first processing chamber 202 connected to a second processing chamber 218 by way of a wafer transfer chamber 212. The first processing chamber 202, the second processing chamber 218, and the wafer transfer chamber 212 are connected to one or more vacuum elements 224 (e.g., vacuum pumps), which are configured to generate a low pressure ambient within the first processing chamber 202, the second processing chamber 218, and the wafer transfer chamber 212. In some embodiments, the low pressure ambient may have a pressure in a range of between approximately $10^{-3}$ torr and approximately $10^{-5}$ torr, for example.

The first processing chamber 202 comprises first a wafer support element 204 (e.g., an electrostatic wafer chuck) configured to hold a semiconductor substrate 206 upon which an RRAM cell is to be formed. The first processing chamber 202 further comprises an ALD deposition element 208 configured to deposit at least a top portion of a bottom electrode of an RRAM cell by way of an ALD process. In some embodiments, the ALD deposition element 208 may be configured to deposit the entire bottom electrode. The ALD deposition element 208 may comprise gas inlets configured to introduce gas phase precursors (e.g., $TiCl_4$ and $NH_3$ or $N_2/H_2$ precursors to form TiN) into the first processing chamber 202 one at a time and a purge element configured to purge the gas phase precursors. During each growth cycle, precursor molecules of a gas phase precursor react with the molecules on the semiconductor substrate 206 to form an atomic layer. In some embodiments, the ALD deposition element 208 may comprise a plasma enhanced ALD element further comprising an RF plasma generation element configured to generate a plasma that improves deposition rates within the first processing chamber 202.

In some embodiments, the first processing chamber 202 may further comprise a PVD deposition element 210 configured to deposit a bottom portion of the bottom electrode of the RRAM cell by way of a physical vapor deposition (PVD) process. In such embodiments, the PVD deposition element 210 is configured to form the bottom portion of the bottom electrode, while the ALD deposition element 208 is configured to form the top portion of the bottom electrode onto the bottom portion of the bottom electrode.

The wafer transfer chamber 212 is in communication with the first processing chamber 202 and comprises a wafer transfer element 214 (e.g., a wafer transfer robot). The wafer transfer element 214 is configured to move the semiconductor substrate 206 from the first processing chamber 202 to the second processing chamber 218. Since the wafer transfer chamber 212 is held under vacuum, the wafer transfer element 214 is able to transfer the semiconductor substrate 206 to the second processing chamber 218 in-situ (i.e., without breaking the low pressure ambient).

The second processing chamber 218 comprises a second wafer support element 220 configured to hold the semiconductor substrate 206. The second processing chamber also comprises an ALD deposition element 222 configured to deposit a dielectric data storage layer onto the portion of the bottom electrode by way of an ALD process (e.g., using $HfCl_4$ and $H_2O$ precursors to form a dielectric data storage layer comprising $HfO_x$).

Figure 3A:
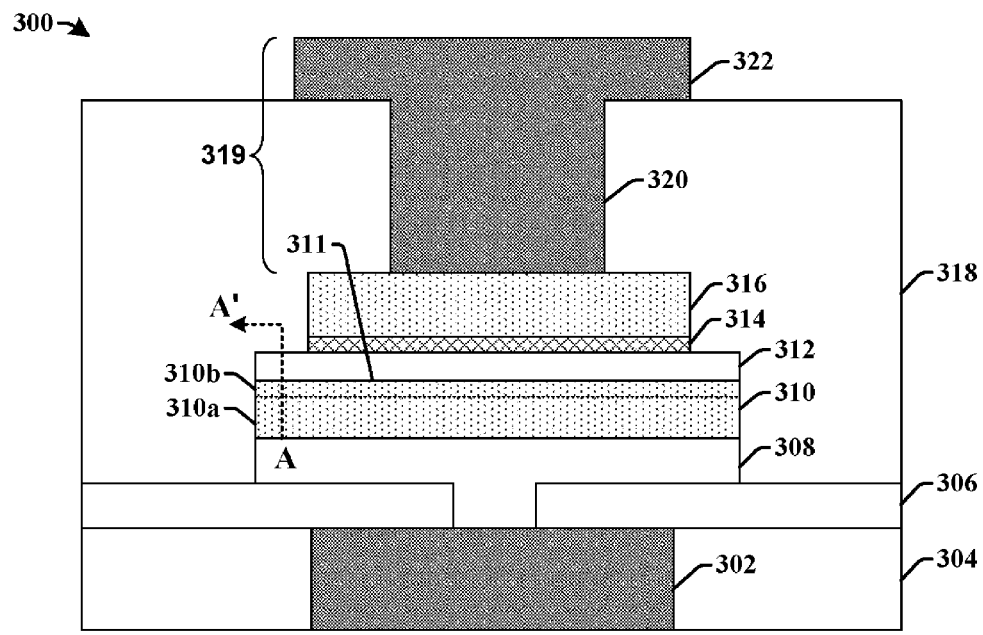
FIG. 3A illustrates a cross-sectional view of some embodiments of RRAM cell having a bottom electrode deposited by an ALD process and an overlying in-situ dielectric data storage layer.

FIG. 3A illustrates a cross-sectional view of an RRAM cell 300 having a bottom electrode 310 formed by an ALD process.

The RRAM cell 300 comprises a diffusion barrier layer 308 disposed onto a bottom dielectric layer 306 and a lower metal interconnect layer 302, which is surrounded by an inter-level dielectric (ILD) layer 304 within a BEOL (back-end-of-the-line) metallization stack. In some embodiments, the lower metal interconnect layer 302 may comprise one of a plurality of metal interconnect layers disposed between the diffusion barrier layer 308 and an underlying semiconductor substrate (not shown). A bottom electrode 310 is disposed onto the diffusion barrier layer 308. The diffusion barrier layer 308 is configured to prevent material from the lower metal interconnect layer 302 from diffusing to the bottom electrode 310.

The bottom electrode 310 has a top surface 311 that has been formed by an ALD process. For example, in some embodiments the bottom electrode 310 may be formed by a continuous ALD process. In other embodiments, the bottom electrode 310 may be formed by a two-phase deposition process in which a bottom portion of the bottom electrode 310a is formed by a PVD process while a top portion of the bottom electrode 310b is formed by an ALD process. In some embodiments, the bottom portion of the bottom electrode 310a may have a larger thickness than the top portion of the bottom electrode 310b.

An in-situ dielectric data storage layer 312 (i.e., a dielectric data storage layer that has been formed in-situ with the underlying bottom electrode layer 310) is disposed onto the top surface 311 of the bottom electrode 310, such that the dielectric data storage layer 312 is in direct contact with the top surface 311 of the bottom electrode 310 formed by the ALD process. The in-situ dielectric data storage layer 312 comprises a variable resistance metal oxide layer that is configured to store a data state. For example, a voltage applied to the in-situ dielectric data storage layer 312 will induce conductive paths (e.g., oxygen vacancies) to form across the dielectric data storage layer 312, thereby reducing the resistance of the in-situ dielectric data storage layer 312. Depending on an applied voltage, the in-situ dielectric data storage layer 312 will undergo a reversible change between a high resistance state and a low resistance state.

Because the in-situ dielectric data storage layer 312 is formed in-situ with the bottom electrode 310, the in-situ dielectric data storage layer 312 directly abuts the bottom electrode 310 without an intervening oxide interface layer that will form when the in-situ dielectric data storage layer 312 is formed ex-situ with the bottom electrode 310. Furthermore, it has been appreciated that the use of an ALD process to form the bottom electrode 310 results in a bottom electrode 310 having a lower $O_2$ concentration than that of a bottom electrode 310 formed using a physical vapor deposition (PVD) process.

Figure 3B:
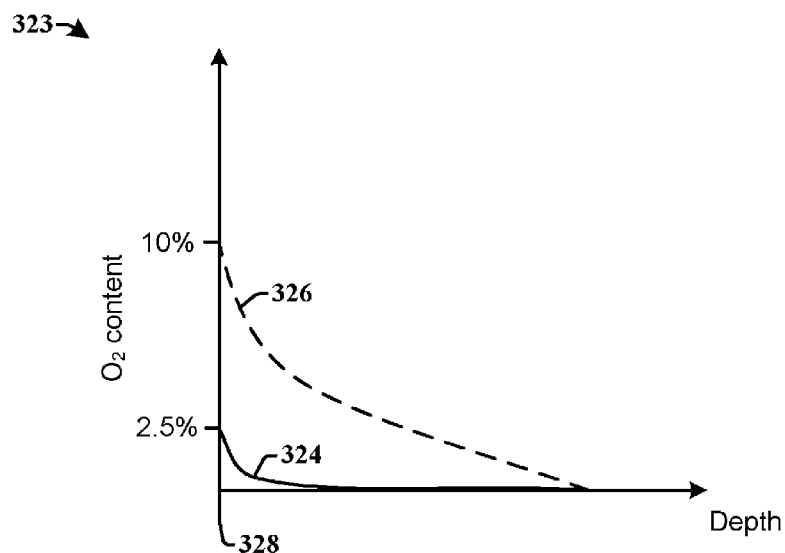
FIG. 3B illustrates a graph showing some embodiments of an exemplary XPS depth profile of the bottom electrode and the in-situ dielectric data storage layer of an RRAM cell.

For example, FIG. 3B illustrates some embodiments of a graph 323 showing an exemplary x-ray photoelectron spectroscopy (XPS) depth profile 324 showing the oxygen content of bottom electrode 310 (along cross-sectional line A-A'). Graph 323 further illustrates an XPS depth profile 326 showing the oxygen content of a bottom electrode formed using a PVD process.

As shown in XPS depth profile 324, the oxygen content of bottom electrode 310 increases with a relatively small slope until a position close to an interface 328 between the bottom electrode 310 and the overlying dielectric data storage layer 312. The XPS depth profile 324 reaches a maximum oxygen content of approximately 2.5% at the interface 328. XPS depth profile 326 shows that the oxygen content of a bottom electrode formed using a PVD process increases with a substantially larger slope and reaches a maximum oxygen content of approximately 10% at the interface 328.

Referring again to FIG. 3A, in some embodiments, a capping layer 314 may be disposed over the dielectric data storage layer 312. The capping layer 314 is configured to store oxygen, which can facilitate resistance changes within the dielectric data storage layer 312. In some embodiments, the capping layer 314 may comprise a metal or a metal oxide that is relatively low in oxygen concentration. A top electrode 316 is disposed over the capping layer 314, and an upper metal interconnect layer 319 is disposed over the top electrode 316. In some embodiments, the upper metal interconnect layer 319 may comprise an upper metal via layer 320 and an upper metal wire layer 322 comprising a conductive material (e.g., copper, aluminum, etc.).

Figure 4:
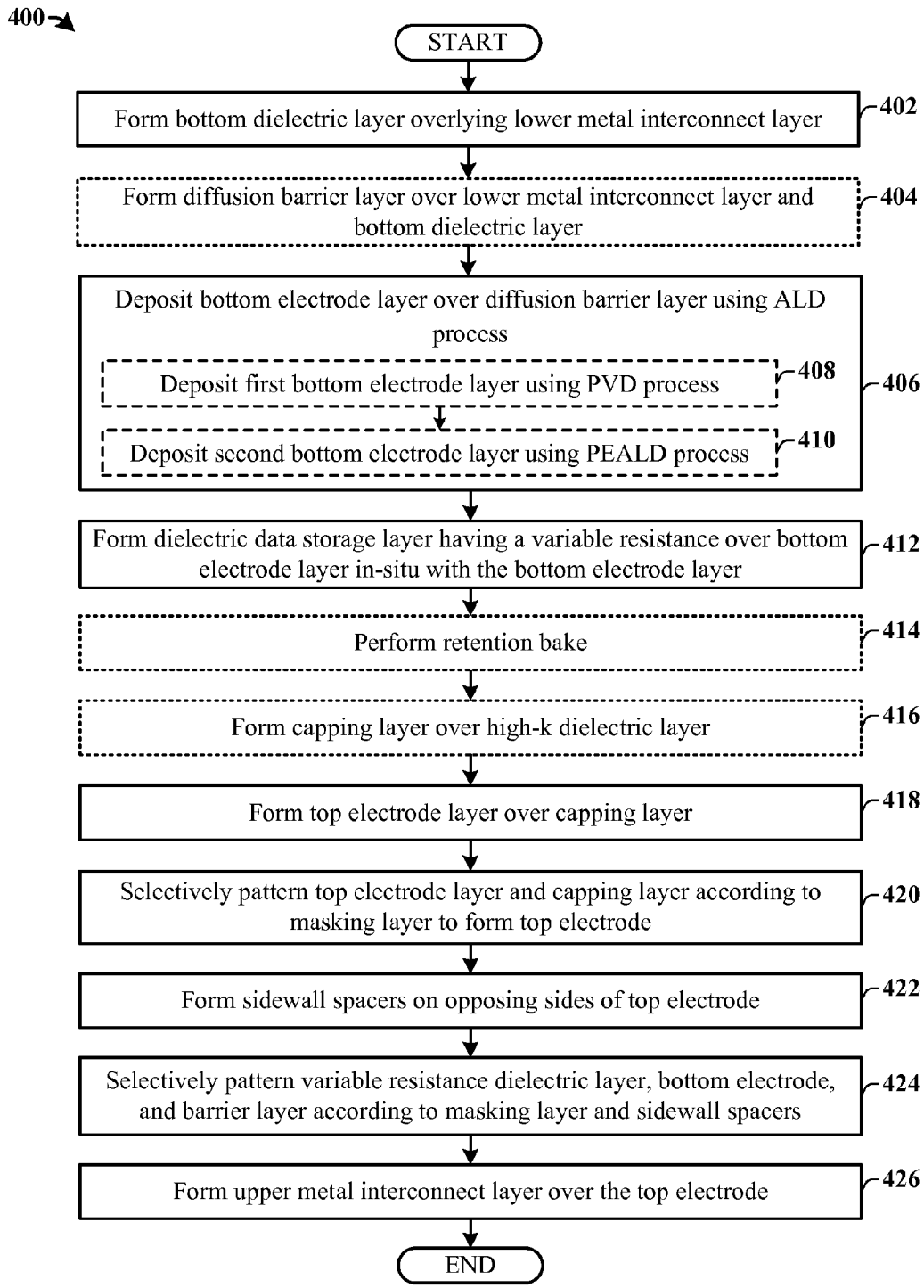
FIG. 4 illustrates a flow diagram of some additional embodiments of a method of forming a RRAM cell using an ALD process to form a bottom electrode and an in-situ deposition process to form an overlying dielectric data storage layer.

FIG. 4 illustrates some additional embodiments of a method 400 of forming an RRAM cell using an ALD process to form a bottom electrode and an in-situ ALD process to form an overlying dielectric data storage layer.

While disclosed methods (e.g., methods 100, 400, and 1500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At 402, a bottom dielectric layer is formed over a lower metal interconnect layer. The bottom dielectric layer has an opening that exposes the lower metal interconnect layer.

At 404, a diffusion barrier layer may be formed over the lower metal interconnect layer and the bottom dielectric layer, in some embodiments. The diffusion barrier layer may be deposited into an opening in a bottom dielectric that exposes an underlying metal interconnect layer, so that the diffusion barrier layer abuts the underlying metal layer.

At 406, a bottom electrode layer is formed over the diffusion barrier layer using an ALD process. In some embodiments, the bottom electrode layer may be formed by depositing a first bottom electrode layer onto the diffusion barrier layer using a PVD process, at 408. A second bottom electrode layer may be subsequently formed onto and in direct contact with the first bottom electrode layer using an ALD process, at 410.

At 412, a dielectric data storage layer is formed over bottom electrode layer in-situ with the formation of the bottom electrode layer. The dielectric data storage layer has a variable resistance that is configured to undergo a reversible change between a high resistance state and a low resistance state depending on a voltage applied to the bottom electrode or the top electrode. In some embodiments, the dielectric data storage layer may comprise a high-k dielectric layer.

At 414, a retention bake is performed. The retention bake improves the switching window of an RRAM cell (i.e., improves differentiation between data states of an RRAM cell). In some embodiments, the retention bake is performed at an elevated temperature in a range of between approximately 150° C. and approximately 250° C., for a time in a range of between approximately 24 hours and approximately 100 hours.

At 416, a capping layer may be formed over the dielectric data storage layer, in some embodiments.

At 418, a top electrode layer is formed over the capping layer.

At 420, the top electrode layer and the capping layer are selectively patterned according to a masking layer. Selective patterning of the top electrode layer forms the top electrode of the RRAM cell.

At 422, sidewall spacers are formed on opposing sides of the top electrode and the capping layer.

At 424, the dielectric data storage layer, the bottom electrode layer, and the diffusion barrier layer are selectively patterned according to the masking layer and the sidewall spacers. Selective patterning of the bottom electrode layer forms the bottom electrode of the RRAM cell At 426, an upper metal interconnect layer is formed over the top electrode. In some embodiments, the upper metal interconnect layer may comprise an upper metal via layer formed onto the top electrode and an upper metal wire layer formed onto the upper metal via layer.

FIGS. 5-13 illustrate some embodiments of cross-sectional views showing a method of forming an RRAM cell using an ALD process to form a bottom electrode and an in-situ ALD process to form an overlying dielectric data storage layer. Although FIGS. 5-13 are described in relation to method 400, it will be appreciated that the structures disclosed in FIGS. 5-13 are not limited to such a method, but instead may stand alone as structures independent of the method.

Figure 5:
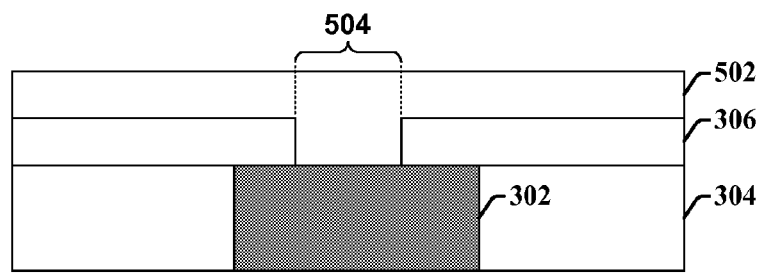
FIGS. 5-12 illustrate some embodiments of cross-sectional views showing a method of forming an RRAM cell using an ALD process to form a bottom electrode and an in-situ ALD process to form an overlying high-k dielectric material.

FIG. 5 illustrates some embodiments of a cross-sectional view 500 corresponding to acts 402-404.

As shown in cross-sectional view 500, a bottom dielectric layer 306 is formed at a position overlying a lower metal interconnect layer 302 disposed within an inter-level dielectric (ILD) layer 304. The bottom dielectric layer 306 comprises an opening 504 that exposes the lower metal interconnect layer 302. A diffusion barrier layer 502 may be deposited within the opening 504 and over the bottom dielectric layer 306 using a deposition technique (e.g., chemical vapor deposition, physical vapor deposition, etc.).

In some embodiments, the lower metal interconnect layer 302 may comprise a conductive metal such as copper or aluminum. In some embodiments, the ILD layer 304 may comprise an oxide, a low-k dielectric, or an ultra low-k dielectric. In some embodiments, the bottom dielectric layer 306 may comprise silicon carbide (SiC) or silicon nitride (SiN), for example. In some embodiments, the diffusion barrier layer 502 may comprise is a conductive oxide, nitride, or oxynitride of a metal such as aluminum (Al), magnesium (Mn), cobalt (Co), titanium (Ti), tantalum (Ta), tungsten (W), nickel (Ni), Tin (Sn), magnesium (Mg), etc.

Figure 6A:
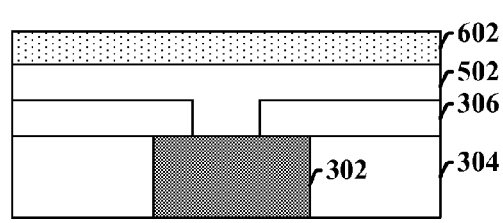
Figure 6B:
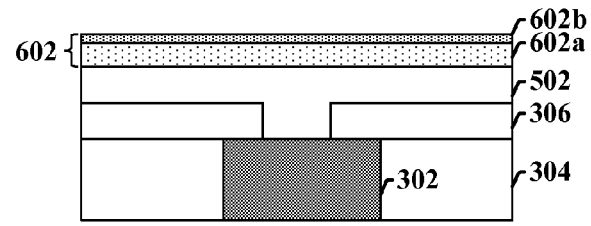

FIGS. 6A-6B illustrate some embodiments of cross-sectional views, 600 and 604, corresponding to act 406.

FIG. 6A illustrates a cross-sectional view 600 in which the bottom electrode layer 602 is formed using a continuous ALD deposition process. The bottom electrode layer 602 may be formed onto the diffusion barrier layer 502. In some embodiments, the ALD process may comprise a plasma enhanced ALD (PEALD) process, which makes use of an RF-plasma to enable higher deposition rates (i.e., higher throughput) and improved film electrical properties at lower temperatures when compared to conventional ALD processes. In various embodiments, the bottom electrode layer 602 may comprise a metal nitride or a metal. For example, in some embodiments, the bottom electrode layer 602 may comprise titanium nitride (TiN) or tantalum nitride (TaN). In other embodiments, the bottom electrode layer 602 may comprise tungsten (W) or copper (Cu).

FIG. 6B illustrates a cross-sectional view 604 in which a bottom electrode layer 602 is formed using a two-phase deposition process that deposits a first bottom electrode layer 602a using a physical vapor deposition (PVD) process and a second bottom electrode layer 602b using a subsequent ALD process. In some embodiments, the first bottom electrode layer 602a may be formed to a first thickness using the PVD process. The second bottom electrode layer 602b may be subsequently formed onto the first bottom electrode layer 602a to a second thickness, which is less than the first thickness, using an ALD process.

The use of the two-phase deposition process to form the bottom electrode layer 602 improves the through-put of method 400, while still providing for a top surface that can provide for an RRAM with improved electrical characteristics. This is because the PVD process provides for a high deposition rate, while the ALD process provides for a top surface that suppresses the out-diffusion of oxygen into the bottom electrode layer 602. In some embodiments, the first bottom electrode layer 602a may be formed to a first thickness having a range of between approximately 50 angstroms and approximately 100 angstroms, while the second bottom electrode layer 602b may be formed to a second thickness having a range of between approximately 15 angstroms and approximately 30 angstroms. Such a second thickness is sufficient to allow for the suppression of the out-diffusion of oxygen in the bottom electrode layer 602.

Figure 7:
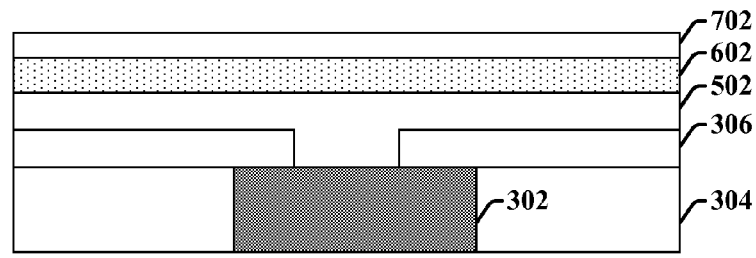

FIG. 7 illustrates some embodiments of a cross-sectional view 700 corresponding to act 412.

As shown in cross-sectional view 700, a dielectric data storage layer 702 having a variable resistance is formed over the bottom electrode layer 602, in-situ (e.g., without removing the substrate from vacuum) with the bottom electrode layer 602. Forming the dielectric data storage layer 702 over the bottom electrode layer 602 deposited by an ALD process improves electrical properties of the RRAM device (e.g., reduces leakage currents). For example, a titanium nitride (TiN) bottom electrode layer deposited by an ALD process has a smaller oxygen concentration gradient than a TiN bottom electrode layer deposited by a PVD process. Therefore, the TiN bottom electrode layer deposited by an ALD process can suppress the out-diffusion of oxygen into the TiN bottom electrode layer, providing for a better interface integrity at an interface between the TiN bottom electrode layer and the dielectric data storage layer. Furthermore, the in-situ formation of the bottom electrode layer 602 and the dielectric data storage layer 702 prevents the formation of an oxide interface layer, which can degrade the electrical performance of RRAM cells (e.g., increase the leakage current of an RRAM cell).

In some embodiments, the dielectric data storage layer 702 may be deposited by way of an ALD process. The ALD process provides for good step coverage that improves the interface between the bottom electrode layer 602 and the dielectric data storage layer 702. In some embodiments, the dielectric data storage layer 702 may comprise a high-k dielectric material. For example, in various embodiments, the dielectric data storage layer 702 may comprise hafnium oxide ($HfO_x$), zirconium oxide ($ZrO_x$), aluminum oxide ($AlO_x$), nickel oxide ($NiO_x$) tantalum oxide ($TaO_x$), or titanium oxide ($TiO_x$).

Figure 8:
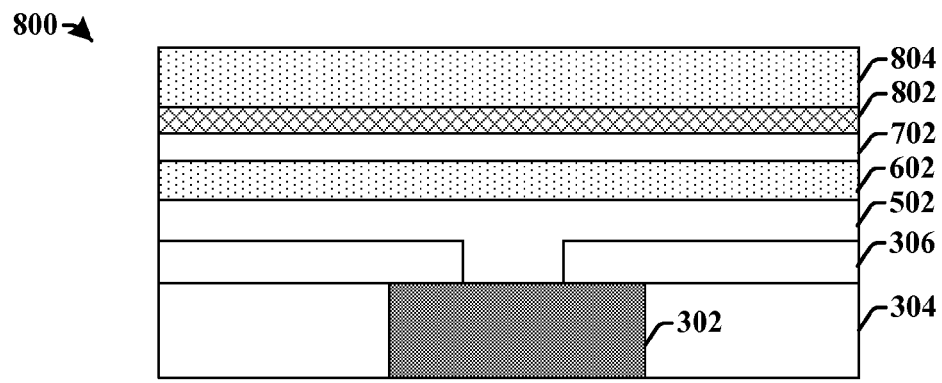

FIG. 8 illustrates some embodiments of a cross-sectional view 800 corresponding to acts 414-416.

As shown in cross-sectional view 800, a capping layer 802 may be formed onto the dielectric data storage layer 702. In some embodiments, the capping layer 802 may comprise a metal such as titanium (Ti), hafnium (Hf), platinum (Pt), and/or aluminum (Al). In other embodiments, the capping layer 802 may comprise a metal oxide such as titanium oxide ($TiO_x$), hafnium oxide ($HfO_x$), zirconium oxide ($ZrO_x$), germanium oxide ($GeO_x$), cesium oxide ($CeO_x$).

A top electrode layer 804 is formed over the capping layer 802. The top electrode layer 804 may be deposited by way of a vapor deposition technique (e.g., physical vapor deposition, chemical vapor deposition, etc.). In various embodiments, the top electrode layer 804 may comprise a metal nitride or a metal. For example, in some embodiments, the top electrode layer 804 may comprise titanium nitride (TiN) or tantalum nitride (TaN). In other embodiments, the top electrode layer 804 may comprise tungsten (W) or copper (Cu).

Figure 9:
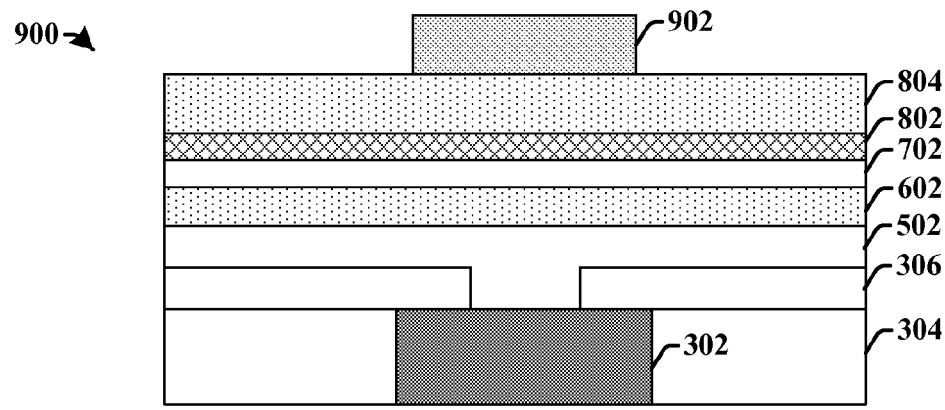

FIG. 9 illustrates some embodiments of a cross-sectional view 900 corresponding to act 418.

As shown in cross-sectional view 900, a masking layer 902 is selectively formed over the top electrode layer 804. The masking layer 902 is configured to define a top electrode of the RRAM cell. In some embodiments, the masking layer 902 may comprise a hard mask layer. For example, the masking layer 902 may comprise a hard mask material, such as silicon-oxide ($SiO_2$), silicon-nitride (SiN), silicon-oxynitride (SiON), or silicon-carbide (SiC).

Figure 10:
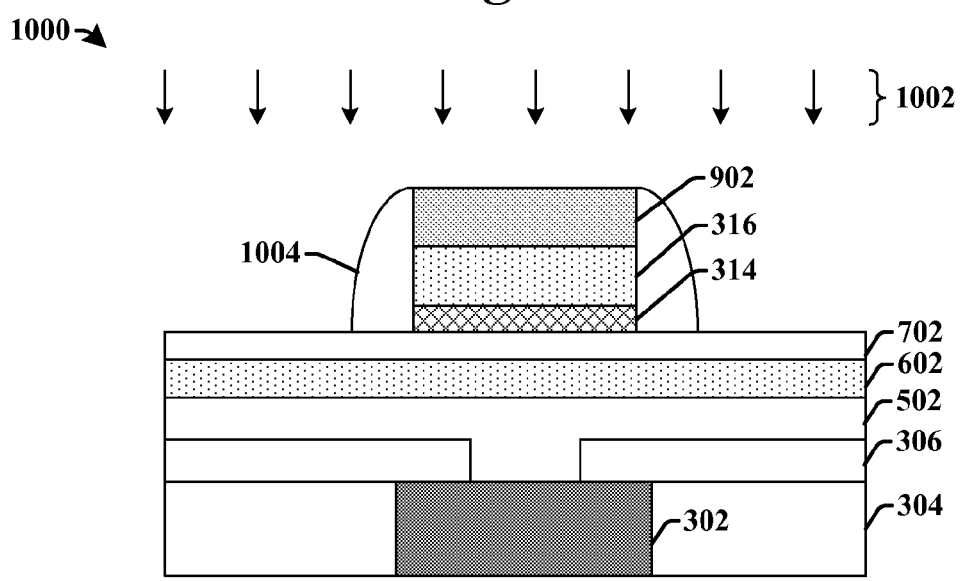

FIG. 10 illustrates some embodiments of a cross-sectional view corresponding to acts 418-420.

As shown in cross-sectional view 1000, a first patterning process is performed to pattern the top electrode layer 804 and the capping layer 802. The first patterning process selectively exposes the top electrode layer 804 and the capping layer 802 to an etchant 1002 in areas not covered by the masking layer 902, resulting in a top electrode 316 and a patterned capping layer 314. The top electrode has a first width. Sidewall spacers 1004 are then formed on opposing sides of the top electrode 316 and the patterned capping layer 1002. In some embodiments, the sidewall spacers 1004 may be formed by depositing nitride onto the dielectric data storage layer 702 and selectively etching the nitride to form the sidewall spacers 1004.

Figure 11:
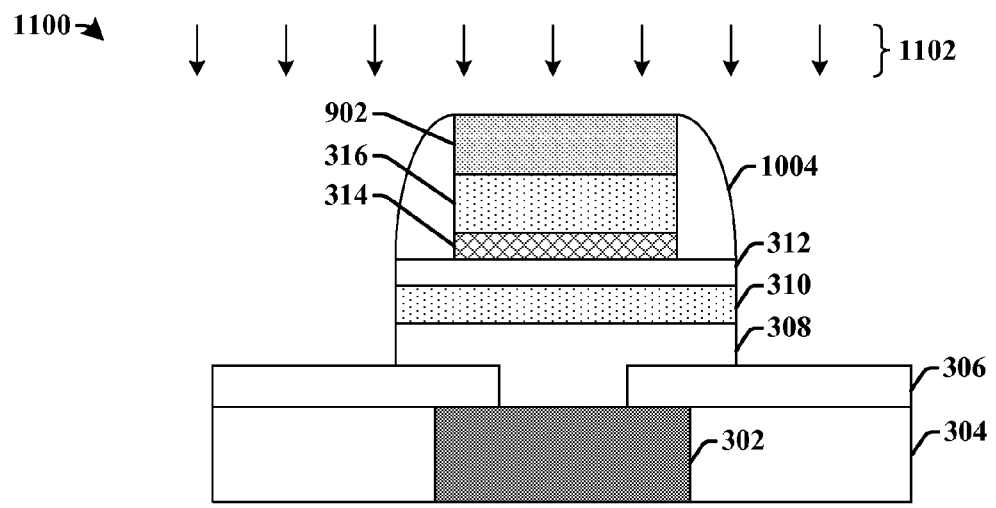

FIG. 11 illustrates a cross-sectional view 1100 of some embodiments corresponding to act 422.

As shown in cross-sectional view 1100, a second patterning process is performed to pattern the dielectric data storage layer 702, the bottom electrode layer 602, and the diffusion barrier layer 308. The second patterning process selectively exposes the dielectric data storage layer 702, the bottom electrode layer 602, and the diffusion barrier layer 308 to an etchant in areas not covered by the masking layer 902 or the sidewall spacers 1104, resulting in a patterned dielectric data storage layer 312, a bottom electrode, and a patterned diffusion barrier layer 308. The bottom electrode has a second width that is larger than the first width of the top electrode (since the bottom electrode layer 602 is patterned by way of masking layer 902 and sidewall spacers 1104).

Figure 12:
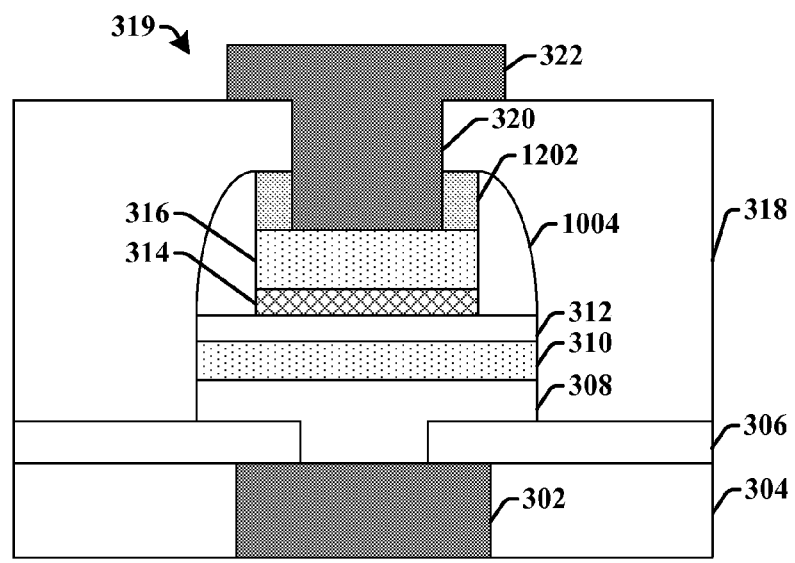

FIG. 12 illustrates a cross-sectional view 1200 of some embodiments corresponding to act 424.

As shown in cross-sectional view 1200 an upper metal interconnect layer 319 is formed over the top electrode 316. In some embodiments, the upper metal interconnect layer 319 may comprise an upper metal via layer 320 and an upper metal wire layer 322. In some embodiments, the upper metal interconnect layer 319 may be formed by depositing a dielectric layer 318 onto the RRAM memory cell. An etching process is then performed to form an opening that extends through the dielectric layer 318 and the hard mask layer 1202 to expose the top electrode 316. The opening is subsequently filled with a metal (e.g., copper, aluminum, etc.) to form the upper metal via layer 320 and an upper metal wire layer 322.

Figure 13:
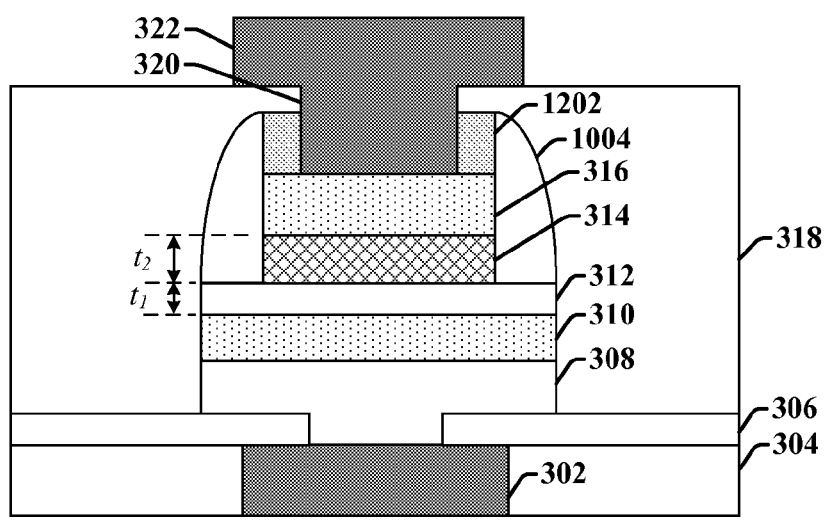
FIG. 13 illustrates a cross-sectional view of some embodiments of RRAM cell having an improved yield.

FIG. 13 illustrates a cross-sectional view of some embodiments of RRAM cell 1300 having an improved yield.

RRAM cell 1300 comprises a dielectric data storage layer 312 disposed between a bottom electrode 310 and a top electrode 316. The dielectric data storage layer 312 may comprise a high-k dielectric layer (i.e., a dielectric layer having a dielectric constant over 3.9). A capping layer 314 is disposed between the bottom electrode 310 and the top electrode 316 at a position overlying and abutting the dielectric data storage layer 312. In some embodiments, the capping layer 314 may comprise a metal (e.g., Ti, Hf, Pt, and/or Al) or a metal oxide (e.g., $TiO_x$, $HfO_x$, $ZrO_x$, $GeO_x$, and/or $CeO_x$).

It has been appreciated that while the in-situ formation of the bottom electrode 310 and dielectric data storage layer 312 may improve RRAM cell performance, the yield of integrated chips comprising RRAM cells depends on a thickness ratio between the dielectric data storage layer 312 and the capping layer 314. Therefore, in some embodiments, the yield may be improved by having the capping layer 314 have a thickness $t_2$ that is in a range of between approximately 2 to 3 times a thickness $t_1$ of the dielectric data storage layer 312. For example, in some embodiments, the dielectric data storage layer 312 may have a thickness $t_1$ that is in a range of between approximately 40 angstroms and approximately 60 angstroms, while the capping layer 314 may have a thickness $t_2$ that is in a range of between approximately 75 angstroms and approximately 150 angstroms.

In various embodiments, the dielectric data storage layer 312 may comprise hafnium aluminum oxide (HfAlO), hafnium tantalum oxide (HfTaO), tantalum aluminum oxide (TaAlO), hafnium silicon oxide (HfSiO), and/or tantalum silicon oxide (TaSiO). Typically, during the formation of a dielectric data storage layer 312 comprising HfAlO, chlorine (Cl) atoms are deposited within the HfAlO, due to precursor species used in the formation of the HfAlO layer. The chlorine atoms generate hole traps that can degrade performance of the RRAM cell 1300. It has been further appreciated that decreasing the number of chlorine atoms in the dielectric data storage layer 312 can further improve yield of the RRAM cell 1300. Therefore, in some embodiments, the dielectric data storage layer 312 may have a chlorine impurity content that is approximately 0.9%.

Thus, RRAM cell 1300 provides for integrated chips (ICs) with improved yield, by adjusting a thickness ratio between the dielectric data storage layer 312 and the capping layer 314 (e.g., a C/D ratio to a value of between approximately 2 to approximately 3) in conjunction with using a data storage layer having a low chlorine impurity content.

Figure 14:
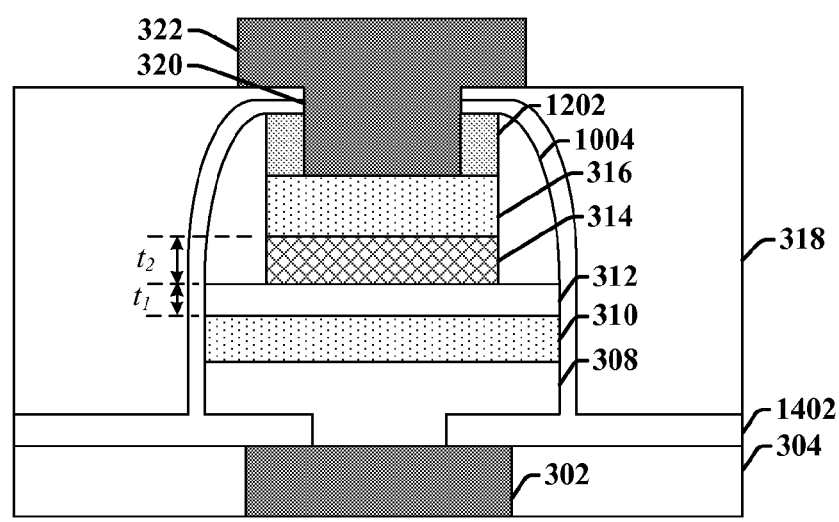
FIG. 14 illustrates a cross-sectional view of some additional embodiments of RRAM cell.

FIG. 14 illustrates a cross-sectional view of some additional embodiments of RRAM cell 1400.

RRAM cell 1400 comprises an insulating layer 1402 disposed between the RRAM stack and the dielectric layer 318. The insulating layer 1402 abuts sidewalls of the diffusion barrier layer 308, the bottom electrode, the dielectric data storage layer, and the sidewall spacers. The insulating layer 1402 may further abut the top of the hard mask layer 1202. The insulating layer 1402 protects the RRAM stack during fabrication thereby preventing damage to the stack and improving yield. In some embodiments, the insulating layer 1402 may comprise silicon carbide (SiC) or silicon nitride (SiN), for example.

Figure 15:
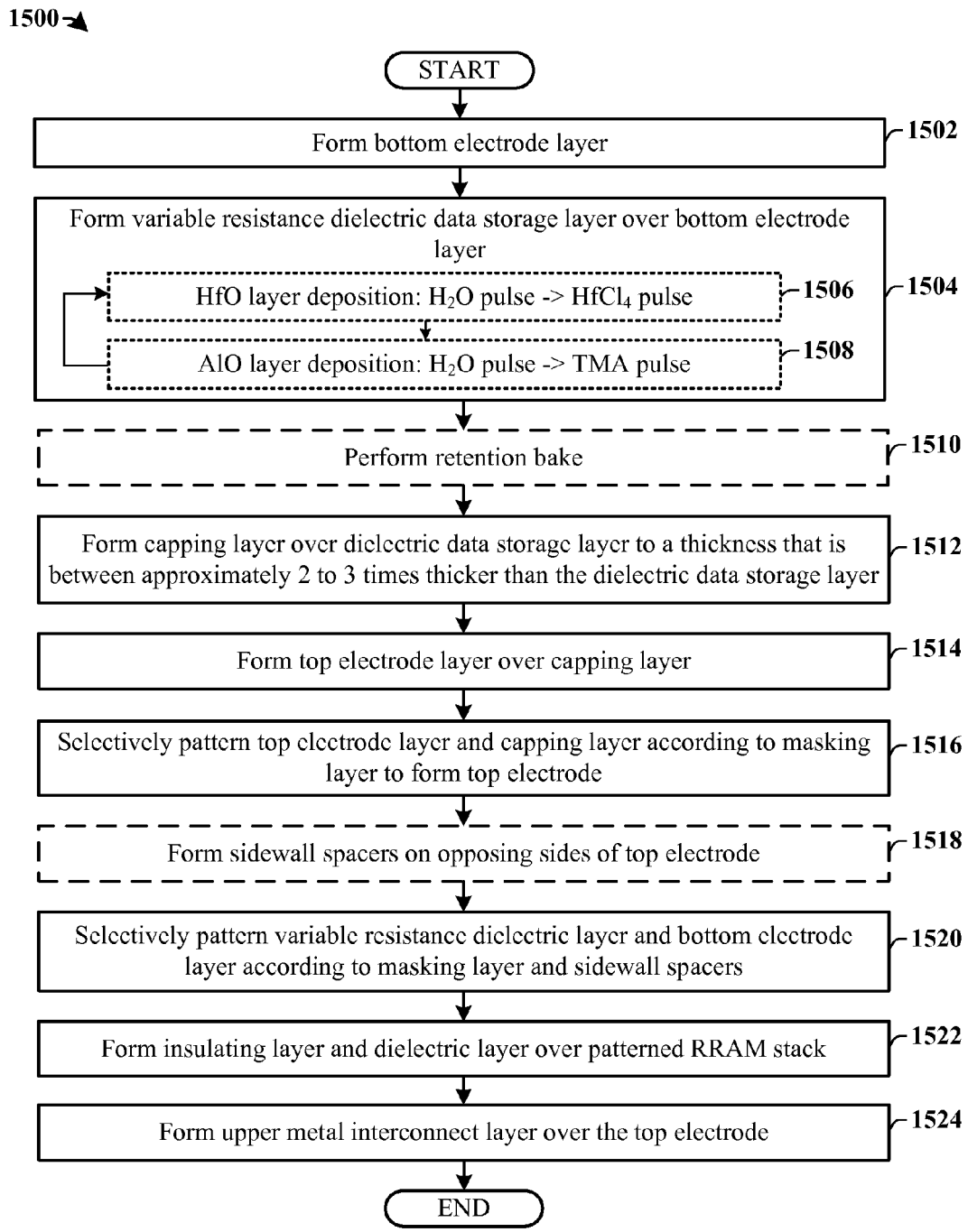
FIG. 15 illustrates some additional embodiments of a method of forming an RRAM cell.

FIG. 15 illustrates some additional embodiments of a method 1500 of forming an RRAM cell. Method 1500 forms a data storage layer and a capping layer in a manner that improves yield of a resulting RRAM cell.

At 1502, a bottom electrode layer is formed. In some embodiments, the bottom electrode layer may be formed over a substrate using an atomic layer deposition (ALD) process.

At 1504, a dielectric data storage layer is formed over the bottom electrode layer. In some embodiments, the dielectric data storage layer may be formed in-situ with the formation of the bottom electrode layer. The dielectric data storage layer has a variable resistance that is configured to undergo a reversible change between a high resistance state and a low resistance state depending on a voltage applied to a bottom electrode or a top electrode.

In some embodiments, the dielectric data storage layer may comprise a high-k dielectric layer formed by way of an ALD process. For example, the dielectric data storage layer may comprise a hafnium aluminum oxide (HfAlO) layer formed using an ALD process that alternates between a first plurality of cycles that respectively form a hafnium oxide (HfO) layer (act 1506) and a second plurality of cycles that respectively form an aluminum oxide (AlO) layer (act 1508). The number of the first and second plurality of cycles will depend upon a thickness of the dielectric data storage layer.

At 1510, a retention bake may be performed, in some embodiments. In some embodiments, the retention bake is performed at an elevated temperature in a range of between approximately 150° C. and approximately 250° C., for a time in a range of between approximately 24 hours and approximately 100 hours.

At 1512, a capping layer is formed over the dielectric data storage layer. The capping layer may be formed by way of a deposition process (e.g., CVD, PE-CVD, PVD, etc.) to a thickness that is in a range of between approximately 2 to approximately 3 times a thickness of the dielectric data storage layer.

At 1514, a top electrode layer is formed over the capping layer.

At 1516, the top electrode layer and the capping layer are selectively patterned according to a masking layer. Selective patterning of the top electrode layer forms the top electrode of the RRAM cell.

At 1518, sidewall spacers may be formed on opposing sides of the top electrode and the capping layer, in some embodiments.

At 1520, the dielectric data storage layer and the bottom electrode layer are selectively patterned according to the masking layer and the sidewall spacers. Selective patterning of the bottom electrode layer forms the bottom electrode of the RRAM cell.

At 1522, an insulating layer and a dielectric layer are formed over the patterned RRAM stack. In some embodiments, the dielectric layer may comprise an inter-level dielectric (ILD) layer comprising a low-k dielectric material, an ultra low-k dielectric material, or an extreme low-k dielectric material.

At 1524, an upper metal interconnect layer is formed over the top electrode. In some embodiments, the upper metal interconnect layer may comprise an upper metal via layer formed onto the top electrode and an upper metal wire layer formed onto the upper metal via layer.

Figure 16:
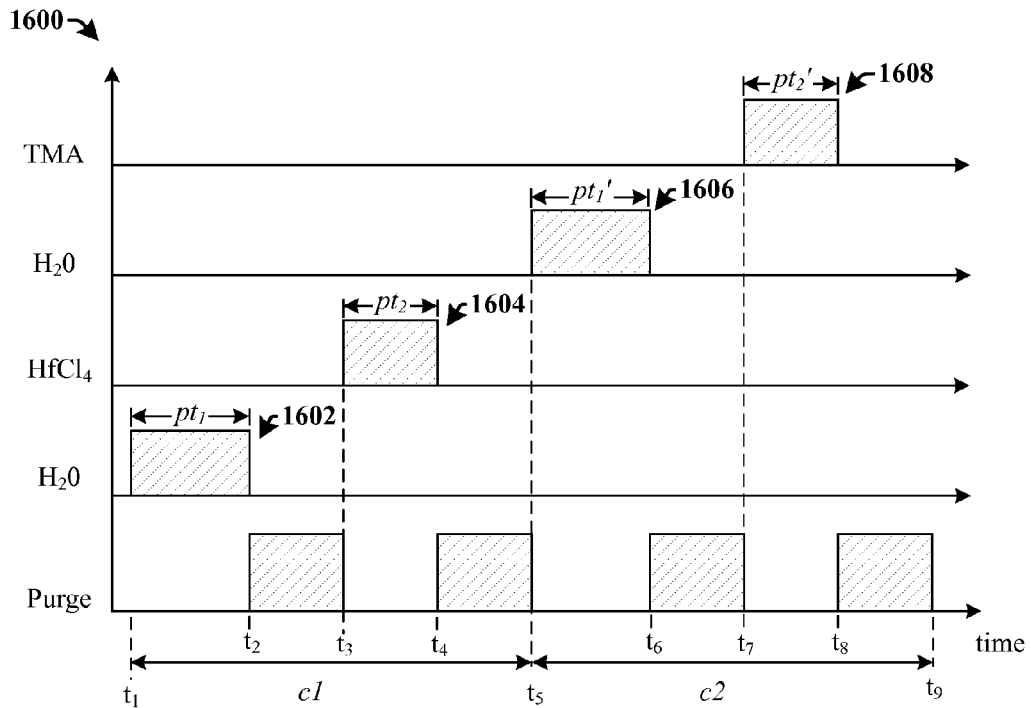
FIG. 16 shows an exemplary timing diagram of some embodiments of an atomic layer deposition process used to form a data storage layer comprising hafnium aluminum oxide.

FIG. 16 shows an exemplary timing diagram 1600 of some embodiments of an atomic layer deposition (ALD) process used to form a dielectric data storage layer comprising hafnium aluminum oxide (HfAlO). The ALD process forms the HfAlO using alternating deposition cycles, $c_1$ and $c_2$, that respectively deposit layers of hafnium oxide (HfO) and aluminum oxide (AlO). Although the ALD cycles are illustrated as being in a certain order, it will be appreciated that the order may be reversed in some embodiments (e.g., the $H_2O$ pulse may be performed before the $HfCl_4$ pulse)

As shown in timing diagram 1600, during a first deposition cycle c1, a first precursor gas pulse 1602 may be performed at time $t_1$ to introduce water ($H_2O$) into a processing chamber. The first precursor gas pulse 1602 forms a monolayer of $H_2O$ molecules on a substrate. The $H_2O$ is then purged from the processing chamber between times $t_2$-$t_3$. A second precursor gas pulse 1604 may be performed at time $t_3$ to introduce hafnium tetrachloride ($HfCl_4$) into the processing chamber. The $HfCl_4$ reacts with the monolayer of $H_2O$ molecules to produce a monolayer of HfO on the substrate. The $HfCl_4$ may then by purged from the processing chamber between times $t_4$-$t_5$.

In a second deposition cycle c2, a third precursor gas pulse 1606 may be performed at time $t_5$ to introduce $H_2O$ into the processing chamber. The third precursor gas pulse 1606 forms a monolayer of $H_2O$ molecules on the monolayer of HfO. The $H_2O$ is then purged from the processing chamber between times $t_6$-$t_7$. A fourth precursor gas pulse 1608 may be performed at time $t_7$ to introduce Trimethyl-aluminum ($Al_2(CH_3)_6$ or TMA) into the processing chamber. The TMA reacts with the monolayer of $H_2O$ molecules to produce a monolayer of AlO on the monolayer of HfO. The TMA may then by purged from the processing chamber between times $t_8$-$t_9$.

The first and second deposition cycles, c1 and c2, may be iteratively repeated to control a thickness of the HfAlO layer. This is because each deposition cycle, c1 and/or c2, will form an atomic layer of material. Therefore, the more ALD deposition cycles that are performed, a larger a thickness of the HfAlO data storage layer.

Typically, during the formation of the monolayer of HfO, chlorine (Cl) atoms are deposited within the monolayer of HfO, due to chlorine within the $HfCl_4$ precursor. The chlorine atoms generate hole traps in the monolayer of HfO, which can degrade performance of an RRAM cell. It has been appreciated that chlorine impurities in the HfO can be reduced by increasing the $H_2O$ pulse time $pt_1$. Therefore, by increasing a pulse time $pt_1$ of $H_2O$ relative to a pulse time $pt_2$ of $HfCl_4$, a monolayer of HfO is formed having reduced chlorine impurities. For example, the second pulse time $pt_2$ may be two or more times longer than the first pulse time $pt_1$. Increasing the $H_2O$ pulse time $pt_1$ further increases the O(—OH) content. The increased OH content improves device switching and performance uniformity. In some embodiments, the $H_2O$ pulse time $pt_1$ during the first deposition cycle c1 may have a duration in a range of between approximately 1000 milliseconds (ms) and approximately 2000 ms and the $H_2O$ pulse time $pt_1'$ during the second cycle c2 may have a duration in a range of between approximately 500 ms and approximately 1500 ms.

Figures 17, 18:
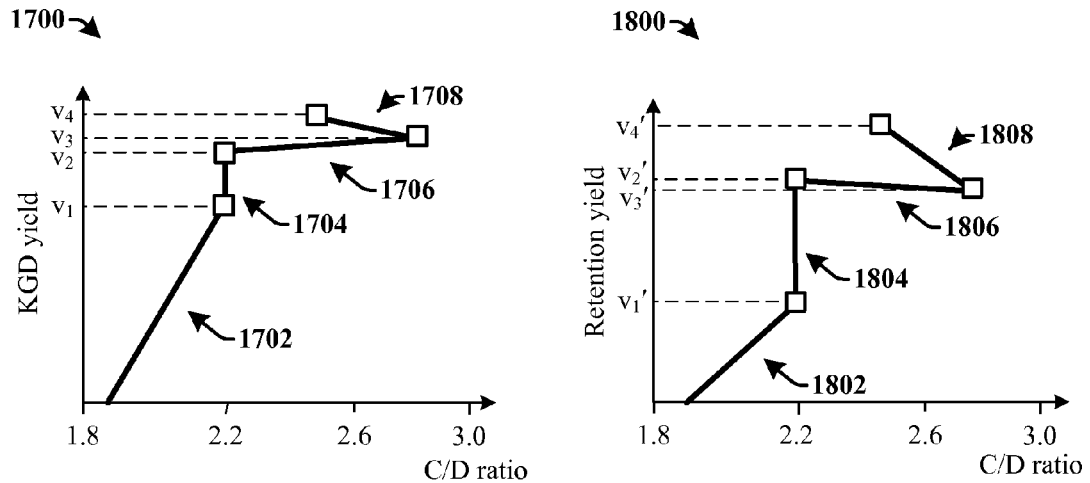
FIG. 17 illustrates some embodiments of a graph showing a known good die yield of an integrated chip having a plurality of RRAM cells.
FIG. 18 illustrates some embodiments of a graph showing a retention yield of an integrated chip having a plurality of RRAM cells.

FIG. 17 illustrates some embodiments of a graph 1700 showing known good die (KGD) yield of an integrated chip having a plurality of RRAM cells. The graph 1700 illustrates a ratio of a capping layer thickness to a dielectric data storage layer thickness (C/D ratio) along the x-axis and a KGD yield (i.e., a yield of unpackaged IC die) on the y-axis.

As shown in graph 1700, in a first region 1702, as a thickness of the capping layer is increased, the ratio of the capping layer thickness to the dielectric data storage layer thickness (C/D ratio) increases also. The increase in the C/D ratio improves KGD yield of an RRAM cell to a first value of $V_1$.

In a second region 1704, the thickness of the capping layer and the dielectric data storage layer are kept constant, but the $H_2O$ pulse time within an ALD process used to form the dielectric data storage layer is increased. The increase in the $H_2O$ pulse time decreases chlorine impurity content and increases hydrogen molecule content in the resulting dielectric data storage layer, thereby improving KGD yield of an RRAM cell to a second value of $V_2$.

In a third region 1706, the thickness of the capping layer is further increased. The increase in the thickness of the capping layer increases the C/D ratio. However, within the third region, the increase in thickness of the capping layer, corresponds to a relatively small improvement of KGD yield of the RRAM cell to a third value of $V_3$.

In a fourth region 1708, the thickness of the dielectric data storage layer is increased. Increasing the thickness of the dielectric data storage layer (in conjunction with the increased thickness of the capping layer) decreases the C/D ratio. However, by increasing the thickness of the dielectric data storage layer the KGD yield can be further increased to a fourth value of $V_4$.

Thus, as shown by graph 1700, by adjusting a ratio of the thickness of the capping layer and the dielectric data storage layer (e.g., to between 2 and 3) in conjunction with using a dielectric data storage layer having a high hydrogen molecule content and low chlorine impurity content, the yield of an integrated chip having RRAM cells can be increase by between approximately 1.2 and approximately 1.5 times (i.e., $1.2 \geq V_4'/V_1' \geq 1.5$).

FIG. 18 illustrates some embodiments of a graph 1800 showing retention yield of an integrated chip having a plurality of RRAM cells. The graph 1800 illustrates a ratio of a capping layer thickness to a dielectric data storage layer thickness (C/D ratio) along the x-axis and a retention yield (i.e., an IC yield after a retention bake) on the y-axis.

As shown in graph 1800, in a first region 1802, as a thickness of the capping layer is increased, the ratio of the capping layer thickness to the dielectric data storage layer thickness (C/D ratio) increases also. The increase in the C/D ratio improves yield of an RRAM cell to a first value of $V_1'$.

In a second region 1804, the thickness of the capping layer and the dielectric data storage layer are kept constant, but the $H_2O$ pulse time within an ALD process used to form the dielectric data storage layer is increased. The increase in the $H_2O$ pulse time decreases chlorine chlorine impurity content and increases hydrogen molecule content in the resulting dielectric data storage layer, thereby improving yield of an RRAM cell to a second value of $V_2'$.

In a third region 1806, the thickness of the capping layer is further increased. The increase in the thickness of the capping layer increases the C/D ratio. However, within the third region, the increase in thickness of the capping layer, corresponds to a relatively small decrease in yield of the RRAM cell to a third value of $V_3'$.

In a fourth region 1808, the thickness of the dielectric data storage layer is increased. Increasing the thickness of the dielectric data storage layer (in conjunction with the increased thickness of the capping layer) decreases the C/D ratio. However, by increasing the thickness of the dielectric data storage layer the yield can be further increased to a fourth value of $V_4'$.

Thus, as shown by graph 1800, by adjusting a ratio of capping layer to data storage layer thickness (e.g., to between 2 and 3) in conjunction with using a dielectric data storage layer having a high hydrogen molecule content and low chlorine impurity content, the yield of an integrated chip having RRAM cells can be increase by between approximately 2.5 and approximately 3 times (i.e., $2 \geq V_4'/V_1' \geq 3$).

Therefore, the present disclosure relates to a method of forming a resistive random access memory (RRAM) cell having a good yield, and an associated apparatus.

In some embodiments, the present disclosure relates to a method of forming a resistive random access memory (RRAM) cell. The method is performed by forming a bottom electrode over a lower metal interconnect layer. A variable resistance dielectric data storage layer having a first thickness is formed onto the bottom electrode, and a capping layer is formed onto the dielectric data storage layer. The capping layer has a second thickness that is in a range of between approximately 2 to approximately 3 times thicker than the first thickness. A top electrode is formed over the capping layer, and an upper metal interconnect layer is formed over the top electrode.

In other embodiments, the present disclosure relates to a method of forming a resistive random access memory (RRAM) cell. The method comprises forming a bottom electrode, and forming a dielectric data storage layer having a first thickness over the bottom electrode. The method further comprises performing a retention bake after forming the dielectric data storage layer. The method further comprises forming a capping layer onto the dielectric data storage layer, wherein the capping layer has a second thickness that is in a range of between approximately 2 to approximately 3 times thicker than the first thickness. The method further comprises forming a top electrode over the capping layer.

In yet other embodiments, the present disclosure relates to a resistive random access memory (RRAM) cell. The RRAM cell has a bottom electrode disposed over a lower metal interconnect layer, and a variable resistance dielectric data storage layer having a first thickness located over the bottom electrode. The RRAM cell further comprises a capping layer located on the dielectric data storage layer. The capping layer has a second thickness that is in a range of between approximately 2 and approximately 3 times thicker than the first thickness. The RRAM cell further comprises a top electrode disposed over the capping layer, and an upper metal interconnect layer disposed onto the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a resistive random access memory (RRAM) cell, comprising:
   forming a bottom electrode over a lower metal interconnect layer;
   forming a dielectric data storage layer having a first thickness onto the bottom electrode;
   forming a capping layer onto the dielectric data storage layer, wherein the capping layer has a second thickness that is in a range of between approximately 2 to approximately 3 times thicker than the first thickness;
   forming a top electrode over the capping layer; and
   forming an upper metal interconnect layer over the top electrode, wherein the upper metal interconnect layer comprises an upper metal via contacting the top electrode at a location set back from sidewalls of the top electrode by a non-zero setback and an overlying upper metal wire that extends past opposing sidewalls of the upper metal via.

2. The method of claim 1, wherein the first thickness of the dielectric data storage layer is in a range of between approximately 40 angstroms and approximately 60 angstroms.

3. The method of claim 1, wherein the second thickness of the capping layer is in a range of between approximately 75 angstroms and approximately 150 angstroms.

4. The method of claim 1, further comprising:
   performing a retention bake after forming the dielectric data storage layer, wherein the retention bake is performed at a temperature in a range of between approximately 150° C. and approximately 250° C., for a time in a range of between approximately 24 hours and approximately 100 hours.

5. The method of claim 1, wherein the dielectric data storage layer comprises one or more of: hafnium tantalum oxide (HfTaO), tantalum aluminum oxide (TaAlO), hafnium silicon oxide (HfSiO), and tantalum silicon oxide (TaSiO).

6. The method of claim 1, wherein the dielectric data storage layer comprises hafnium aluminum oxide (HfAlO).

7. The method of claim 6, wherein forming the dielectric data storage layer comprises:
performing a first plurality of atomic layer deposition (ALD) deposition cycles that respectively form a hafnium oxide (HfO) layer; and
performing a second plurality of ALD deposition cycles that respectively form an aluminum oxide (AlO) layer onto an underlying hafnium oxide (HfO) layer.

8. The method of claim 7, wherein forming the HfO layer, comprises:
performing an first precursor gas pulse for a first pulse time to introduce water ($H_2O$) into a processing chamber;
purging the processing chamber of the $H_2O$;
performing a second precursor gas pulse for a second pulse time to introduce hafnium tetrachloride ($HfCl_4$) into the processing chamber, wherein the first pulse time is larger than the second pulse time; and
purging the processing chamber of the $HfCl_4$.

9. The method of claim 8, wherein the first pulse time has a duration in a range of between approximately 1000 milliseconds and approximately 2000 milliseconds.

10. The method of claim 1, wherein the top electrode and the capping layer have sidewalls that are substantially aligned along a vertical line.

11. A method of forming a resistive random access memory (RRAM) cell, comprising:
depositing a bottom electrode layer over a lower metal interconnect layer;
depositing a dielectric data storage film onto the bottom electrode layer;
depositing a capping layer onto the dielectric data storage film;
depositing a top electrode layer onto the capping layer;
selectively patterning the top electrode layer and the capping layer to form a top electrode to have a first width;
selectively patterning the dielectric data storage film and the bottom electrode layer to form a bottom electrode to have a second width larger than the first width and to form a dielectric data storage layer having a first thickness over the bottom electrode, wherein the capping layer has a second thickness that is in a range of between approximately 2 to approximately 3 times thicker than the first thickness;
performing a retention bake after forming the dielectric data storage layer;
and
wherein the dielectric data storage layer and the bottom electrode have widths larger than the first width.

12. The method of claim 11, wherein the dielectric data storage layer comprises a hafnium aluminum oxide (HfAlO) formed using an atomic layer deposition process, comprising:
performing a first plurality of atomic layer deposition (ALD) deposition cycles that respectively form a hafnium oxide (HfO) layer; and
performing a second plurality of ALD deposition cycles that respectively form an aluminum oxide (AlO) layer onto an underlying hafnium oxide (HfO) layer.

13. The method of claim 12, wherein depositing the hafnium oxide (HfO) layer, comprises:
introducing a water ($H_2O$) precursor into a processing chamber for a first pulse time to form a monolayer of $H_2O$;
purging the $H_2O$ precursor from the processing chamber;
introducing a hafnium tetrachloride ($HfCl_4$) precursor in the processing chamber for a second pulse time that is two or more times shorter than the first pulse time, wherein the $HfCl_4$ precursor interacts with the monolayer of $H_2O$ to form the hafnium oxide (HfO) layer; and
purging the $HfCl_4$ precursor from the processing chamber.

14. The method of claim 11, wherein the first thickness of the dielectric data storage layer is in a range of between approximately 40 angstroms and approximately 60 angstroms.

15. The method of claim 11, wherein the second thickness of the capping layer is in a range of between approximately 75 angstroms and approximately 150 angstroms.

16. The method of claim 11, wherein the retention bake is performed temporally between depositing the dielectric data storage layer and depositing the capping layer at a temperature in a range of between approximately 150° C. and approximately 250° C., for a time in a range of between approximately 24 hours and approximately 100 hours.

17. A method of forming a resistive random access memory (RRAM) cell, comprising:
forming a bottom electrode over a lower metal interconnect layer, by using a physical vapor deposition (PVD) process to form a lower portion of the bottom electrode and an in-situ plasma enhanced atomic layer deposition (PEALD) process to form an overlying upper portion of the bottom electrode;
forming a dielectric data storage layer having a first thickness, wherein the dielectric data storage layer comprises hafnium aluminum oxide, and
forming a capping layer onto the dielectric data storage layer, wherein the capping layer has a second thickness that is in a range of between approximately 2 to approximately 3 times thicker than the first thickness; and
forming a top electrode over the capping layer.

18. The method of claim 17, wherein forming the dielectric data storage layer comprises:
introducing water into a processing chamber to form a first monolayer of water molecules;
purging the water from the processing chamber after forming the first monolayer of water molecules;
introducing hafnium tetrachloride into the processing chamber after purging the water, wherein the hafnium tetrachloride reacts with the first monolayer of water molecules to produce a monolayer of hafnium oxide;
purging the hafnium tetrachloride from the processing chamber after producing the monolayer of hafnium oxide;
introducing water into the processing chamber after purging the hafnium tetrachloride to form a second monolayer of water molecules over the monolayer of hafnium oxide;
purging the water from the processing chamber after forming the second monolayer of water molecules;
introducing Trimethylaluminum (TMA) into the processing chamber after purging the water, wherein the TMA reacts with the second monolayer of water molecules to produce a monolayer of aluminum oxide on the monolayer of hafnium oxide; and
purging the TMA from the processing chamber after producing the monolayer of aluminum oxide.

19. The method of claim 18, wherein the water is introduced into the processing chamber using a first gas pulse having a first pulse time and the hafnium tetrachloride is introduced into the processing chamber using a second gas pulse having a second pulse time, wherein the second pulse time is shorter than the first pulse time.

20. The method of claim 17, wherein the first thickness is in a first range of between approximately 40 angstroms and approximately 60 angstroms and the second thickness is in a second range of between approximately 75 angstroms and approximately 150 angstroms.

\* \* \* \* \*